United States Patent [19]
Rouse et al.

[11] Patent Number: 5,351,005
[45] Date of Patent: Sep. 27, 1994

[54] RESETTING CLOSED-LOOP MAGNETORESISTIVE MAGNETIC SENSOR

[75] Inventors: Gordon F. Rouse, Arden Hills; Howard B. French, Falcon Heights, both of Minn.

[73] Assignee: Honeywell Inc., Minneapolis, Minn.

[21] Appl. No.: 999,246

[22] Filed: Dec. 31, 1992

[51] Int. Cl.$^5$ .................... G01R 33/06; G01C 17/02
[52] U.S. Cl. ................. 324/252; 33/355 R; 324/207.21; 324/225
[58] Field of Search ........... 324/207.21, 225, 249–255, 324/326, 345; 307/309; 33/355 R, 366 R, 363 Q

[56] References Cited

U.S. PATENT DOCUMENTS 4,525,671  6/1985  Sansom .............. 324/252

FOREIGN PATENT DOCUMENTS 191685  7/1992  Japan ................. 324/252

OTHER PUBLICATIONS

J. Lenz, "A High-Sensitivity Magnetoresistive Sensor", 1990, in IEEE Doc. No. CH2783-9/90/00-00-0114, pp. 114–117.

B. Pant, "Magnetoresistive Sensors", in *Scientific Honeyweller*, vol. 8, No. 1, Fall 1987, pp. 29–34.

Philips Export B. V., "The magnetoresistive Sensor", 1988, in *Philips Technical Publication* 268, pp. 14–18.

Honeywell, "Permalloy Magnetic Sensors", Mar. 1991, in technical sensor description having two pages.

Honeywell, "Advanced Integrated Magnetometer (AIM) Technology", 1989, in a technical brochure, having seven pages.

*Primary Examiner*—Gerard R. Strecker
*Attorney, Agent, or Firm*—John G. Shudy, Jr.

[57] ABSTRACT

A switched-magnetization closed-loop magnetometer having a magnetoresistive bridge for sensing external magnetic fields. The output signal from the bridge to an amplifier, is magnetically nulled by a feedback coil. Each of the bridge elements have a magnetic easy axis that is periodically and magnetically flipped by a reset coil. The output of the amplifier goes to an analog switch and an integrator in one or the other order. The output of the analog switch or the integrator may go on to a sample and hold circuit, or other sampling device, that alternately samples the output to it in synchronism with the reset coil. The output is processed by a low pass amplifier. A clock provides signals to the reset coil, the analog switch and the sample and hold switch.

4 Claims, 15 Drawing Sheets

RESETTING CLOSED-LOOP MAGNETORESISTIVE MAGNETIC SENSOR

BACKGROUND OF THE INVENTION

The present invention pertains to magnetic sensors. Particularly, the invention pertains to magnetoresistor sensors utilized for sensing magnetic fields or disturbances of magnetic fields. More particularly, the invention pertains to magnetically closed-loop, switched-magnetization magnetic sensors.

Magnetic-field sensors have application in magnetic compassing. They also have been a means for detecting magnetic-field variations caused by components in machinery such as metal rods, gears, cams, vehicles, the earth's magnetic fields, explosive mines, weapons, and minerals in mines, among other things.

One kind of magnetic sensor is the magnetoresistive sensor which uses a device composed of magnetoresistive material whose resistance changes in the presence of a magnetic field. Many materials exhibit some magnetoresistance. The effect is particularly large in ferromagnetic materials. However, even aluminum has a magnetoresistance. A very effective magnetoresistive material is a nickel-iron alloy which may be referred to as permalloy.

Any specimen of ferromagnetic material has a magnetization, or a magnetic moment per unit volume—a vector quantity defined at each point in the material. A bar magnet, for example, has a net volume magnetization because the majority of the magnetic moments in the bar are aligned parallel to one another. Suppose one has a very long, thin film of ferromagnetic material such as permalloy, and a current is running along the length of the film. The magnetization of the film generally forms an angle with the current and the film's resistance depends on this angle. When the magnetization is parallel to the current, the resistance of the film is at a maximum, and when the magnetization is perpendicular to the current, the resistance is at a minimum, or nominal, value. Thus, if a permalloy film is subject to an external magnetic field, the field acts on the magnetization, rotating it and thereby changing the film's resistance. It is this change of resistance that is noted and utilized in the measurement of magnetic field variation.

Magnetoresistive sensors are capable of measuring magnetic fields as small as 0.00001 gauss and fields as large as 100 gauss. To illustrate the significance of these magnitudes, a medium-sized car 10 feet away from a sensor would produce a perturbation in the earth's field of about 0.01 gauss; the fields in the vicinity of a magnetic tape are about 10 gauss and the field at the tip of a bar magnet is about 1000 gauss. Magnetoresistive sensors have a large frequency range in that they can measure direct current fields or varying fields having frequencies in excess of 1 gigahertz.

The drawback of commonly used permalloy magnetoresistors is temperature sensitivity which is typically 3000 parts per million per degree Centigrade. Thus, manufacturers have constructed Wheatstone bridges, each having four magnetoresistors arranged in such a fashion as to cancel this first-order temperature effect. However, because of variations in magnetoresistors such as thin-film permalloy resistors caused by nonuniform deposition, the four magnetoresistors are not matched sufficiently to cancel out all of the imbalances in the bridge. When biased with a voltage or current, the bridge will exhibit a temperature-dependent offset in the output. Such output is unacceptable for many applications of magnetic field sensing that require accuracy over a temperature range. It has been suggested in the related art that a magnetoresistive device may be operated as a closed loop sensor in order to reduce cross-axis sensitivity and nonlinearity of the output from the bridge. In such a configuration, the bridge output is magnetically nulled by a feedback coil and functions at the same point on the transducer input-output curve which makes the output linear versus the input field. Further, since the macromagnetization direction is held at a fixed position, the cross-axis sensitivity to external fields is minimized. The closed-loop configuration applied to the magnetoresistive bridge has the advantages of high linearity and dynamic range; but unfortunately, this closed-loop configuration provides no greater reduction in temperature sensitivity than the magnetoresistive bridge in an open-loop configuration.

The magnetization of a permalloy film magnetoresistive bridge can be "set" using a coil that has a direction of magnetic field parallel to the magnetization, i.e., "easy axis", of the magnetic field sensor. Depending on the direction of current in the coil, the magnetization and the input axis of the magnetoresistive bridge can be changed by an angle of 180°. Related art has suggested that switching the magnetization of a magnetoresistive bridge with a coil back and forth from 0° to 180° and so on, and then reading the bridge in each direction and then differencing the readings, the sensor output will be insensitive to thermal drifts and to "unsetting" the bridge in large magnetic fields. This suggested approach was made only in the context of an open-loop configuration which does not eliminate a temperature-dependent offset in the output since the four magnetoresistors of the bridge are not matched well enough to cancel out the total imbalance of the bridge.

SUMMARY OF THE INVENTION

The present invention incorporates both the magnetically closed-loop configuration and the switching of the magnetoresistive bridge to achieve great reduction or elimination of cross-axis sensitivity and nonlinearity of the bridge output and the insensitivity to thermal drifts and unsetting of the bridge in large magnetic fields. The present invention is more acceptable for higher accuracy compass applications, for instance, as opposed to either of the above related art versions of the magnetic sensor.

DESCRIPTION OF THE PREFERRED EMBODIMENTS

Figure 1:
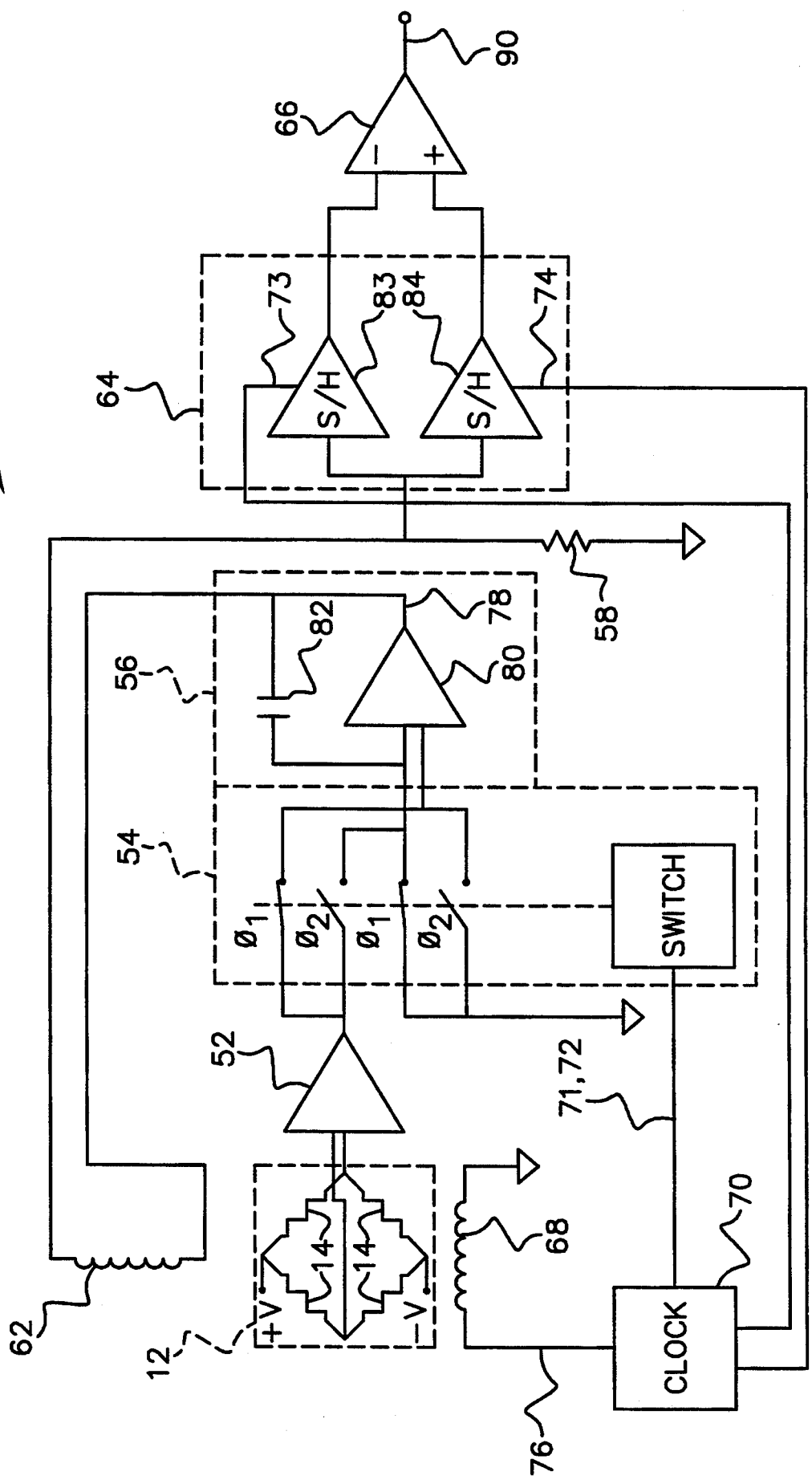
FIG. 1 is a basic schematic of the magnetometer having feedback switches before the integrator and having a sample and hold device.
Figure 2:
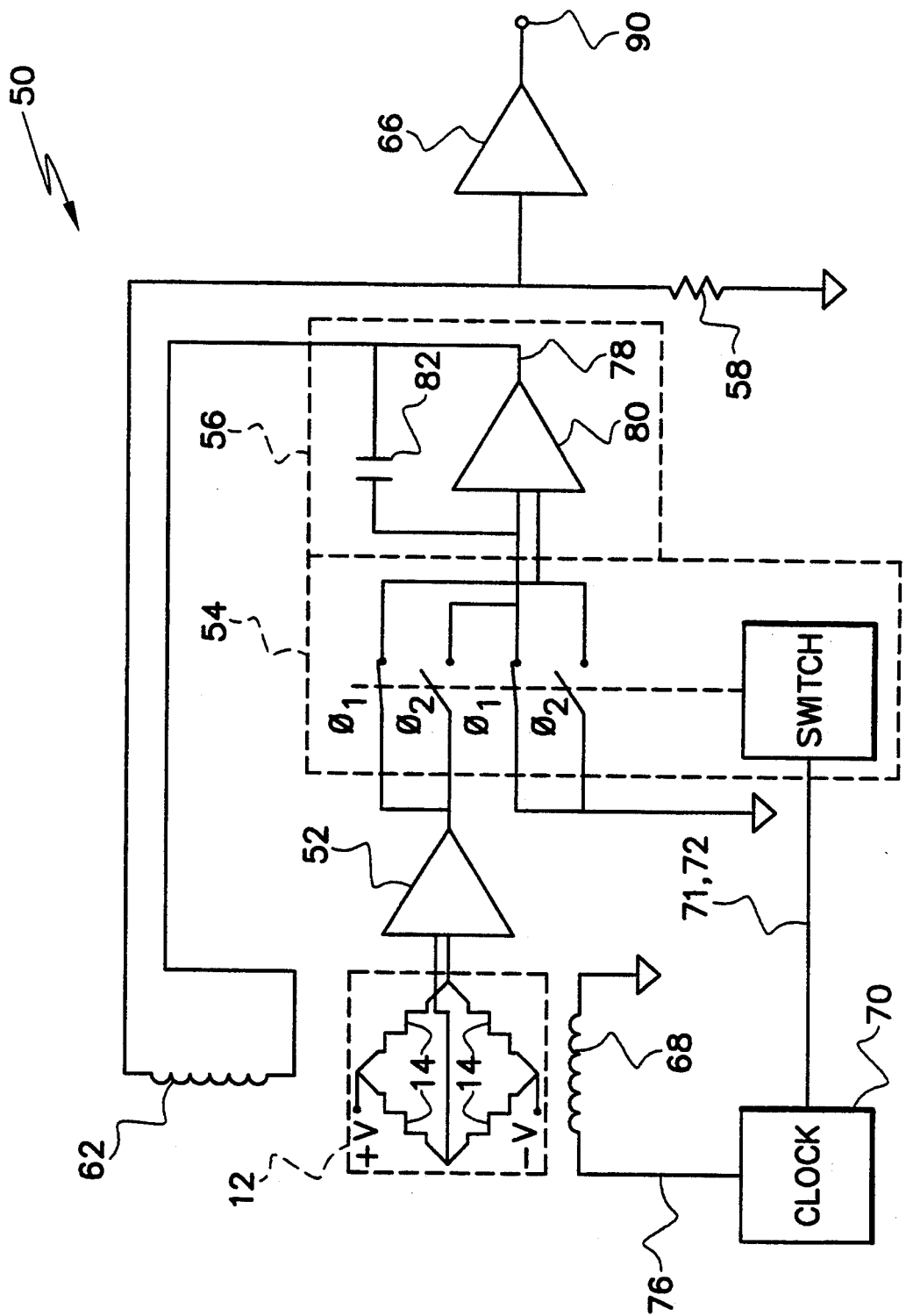
FIG. 2 is a basic schematic of the magnetometer having feedback switches before the integrator and not having a sample and hold device.
Figure 3:
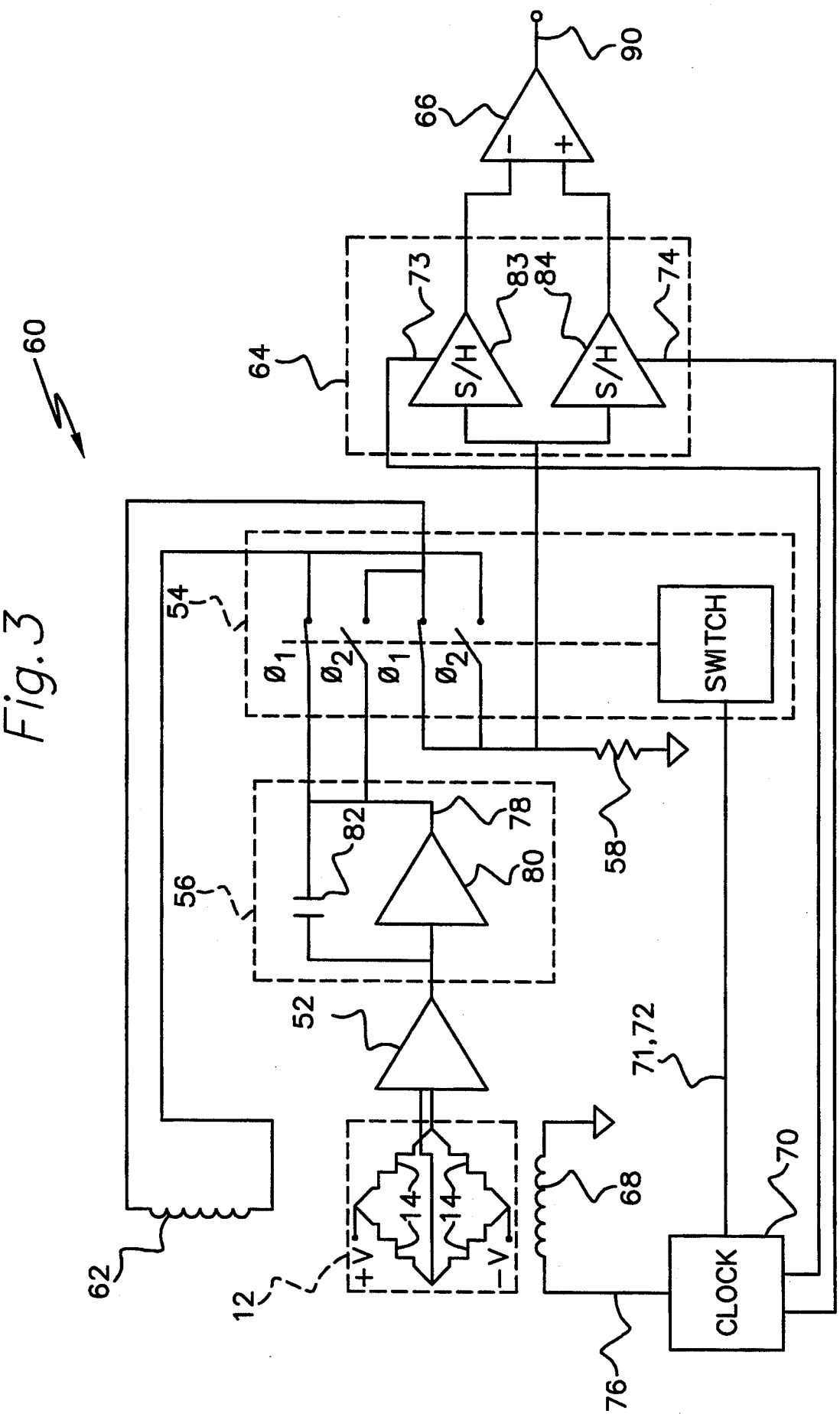
FIG. 3 is a basic schematic of the magnetometer having feedback switches after the integrator and having a sample and hold device.

FIG. 1 is a basic diagram of magnetoresistor sensor 10. Magnetoresistive bridge 12 is a Wheatstone bridge consisting of four magnetoresistors. Each resistor has a resistance that changes in the presence of a magnetic field. A typical magnetoresistor is a thin film of permalloy having a current running along the length of the film. The magnetization of the film generally forms an angle with the current direction and the film's resistance depends on this angle. When the magnetization of the magnetoresistor is parallel to the current, the resistance is at a maximum, and when it is perpendicular to the current, the resistance has its minimum or nominal value. The magnetic resistance of each bridge element is determined by the difference of these two values of resistance. So if a permalloy element is subjected to an external magnetic field, the field acts on the magnetization of the resistor, rotating it and thereby changing the element's resistance. The resistance of the element or permalloy film varies with the square of the cosine of the angle between the magnetization and the current. The absolute resistance of the magnetoresistor is not as significant as the change in resistance with respect to change of the external magnetic field affecting the magnetoresistor. Thus magnetoresistance is more usefully expressed as the ratio of the change in the total resistance to the nominal resistance as a function of the applied magnetic field. In a permalloy element, the maximum change in resistance (i.e., the change when the magnetization is rotated from parallel to the current flow to a perpendicular to the current direction) is about 2 percent of the nominal resistance.

The resistivity $\rho$ of element 14 is given by the following formula:

$$\rho = \rho_o + \Delta\rho\cos^2(\theta+\phi)$$

where $\rho_o$ is the isotropic resistivity, $\Delta\rho$ is the maximum resistivity change and $\theta+\phi$ is the angle between the magnetization and the current. The formula may be written as:

$$\rho = \rho_o + \Delta\rho/2[1+\cos2\theta\cos2\theta - \sin2\phi\sin2\phi]$$

If $\theta=0°$ for an unbiased magnetoresistor, then $$\rho = \rho_o + \Delta\rho/2[1+\cos2\phi]$$

If $\theta=45°$ for a biased magnetoresistor, then $$\rho = \rho_o + \Delta\rho/2[1-\sin2\phi]$$

$$\rho \sim \rho_o + \Delta\rho/2 - \phi\Delta\rho \text{ for } \phi<1$$

Figure 4A:
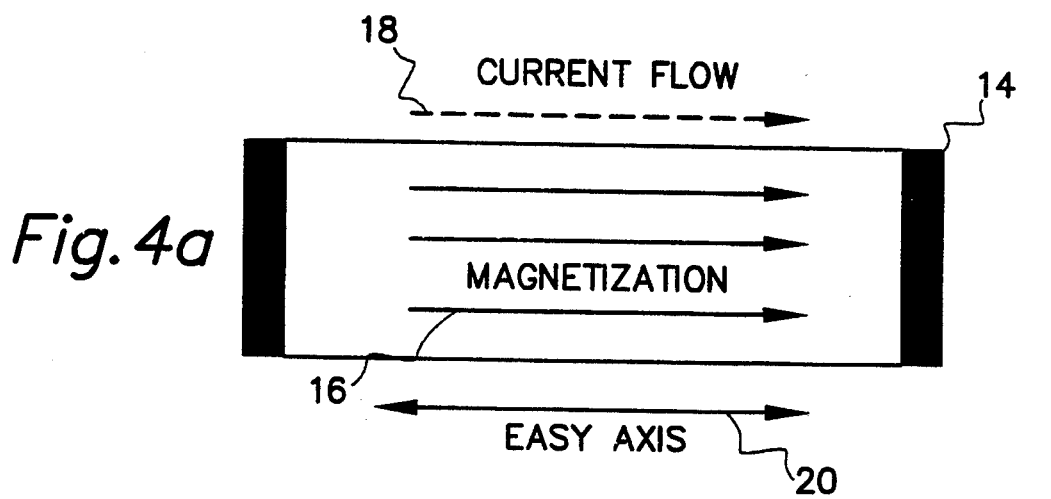
FIGS. 4a–d reveal the magnetoresistance effect and biasing in elements of the sensor.
Figure 4B:
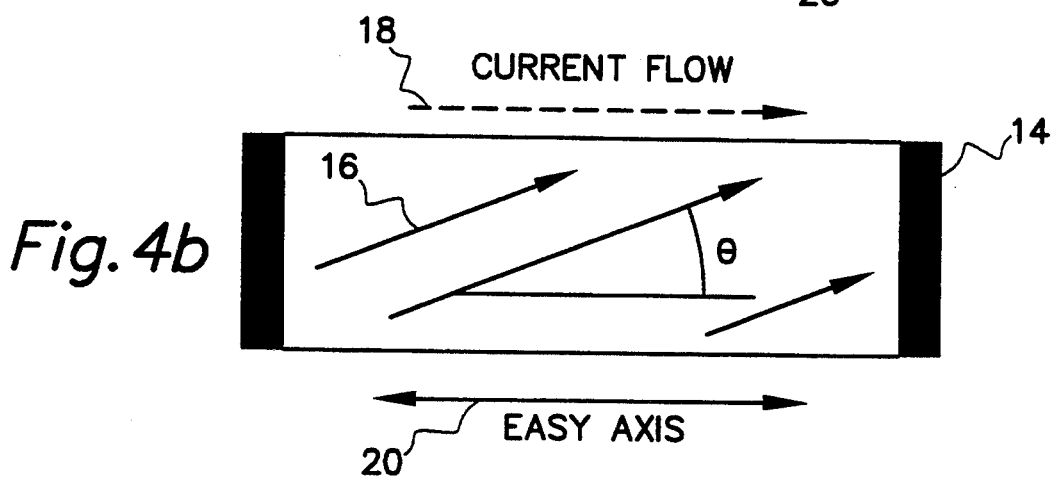
Figure 4C:
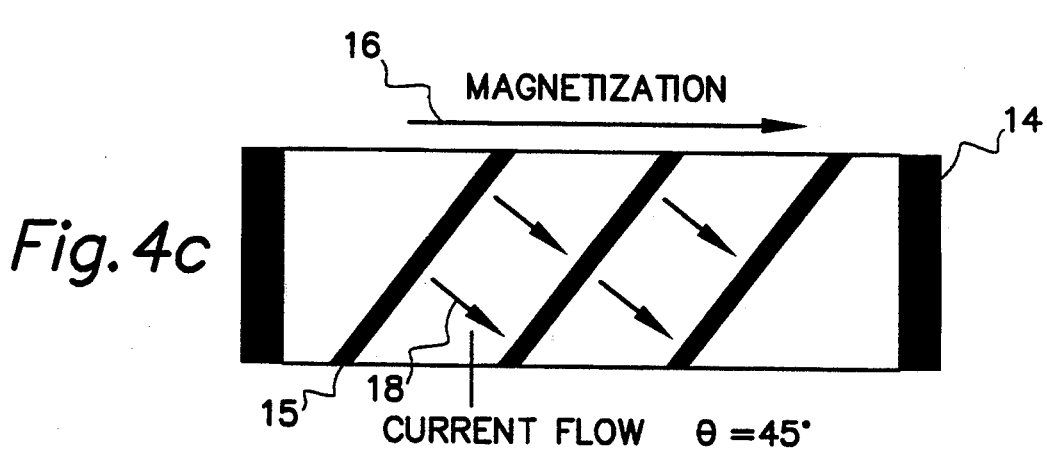
Figure 4D:
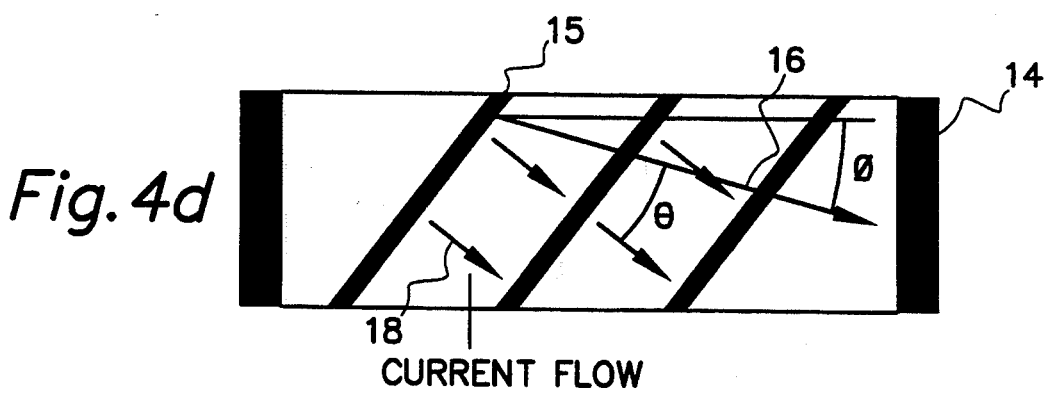

FIGS. 4a-d show the magnetoresistance effect and biasing in elements 14. FIG. 4a shows the "easy axis" 20 or magnetization 16 parallel to the current flow 18 in element 14. The "easy axis" 20 is the direction of the magnetization vector when no magnetic field is applied. FIG. 4b reveals element 14 exposed to a magnetic field which results in a shift in the direction of magnetic vector 16 by an angle of $\theta$ relative to current vector 18. FIG. 4c shows the "barber-pole" biased thin film element 14 wherein current flow vector 18 is biased at an angle of 45° (i.e., $\theta=45°$) relative to magnetization vector 16, with no magnetic field affecting element 14. FIG. 4d also shows the "barber-pole" biased thin film element 14 but under the effect of a magnetic field. Magnetization vector 16 is shifted more parallel to current flow vector 18 by an angle of $\phi$. An angle $\theta$ or 4520 $-\phi$ remains between current vector 18 and magnetization vector 16.

Figure 5:
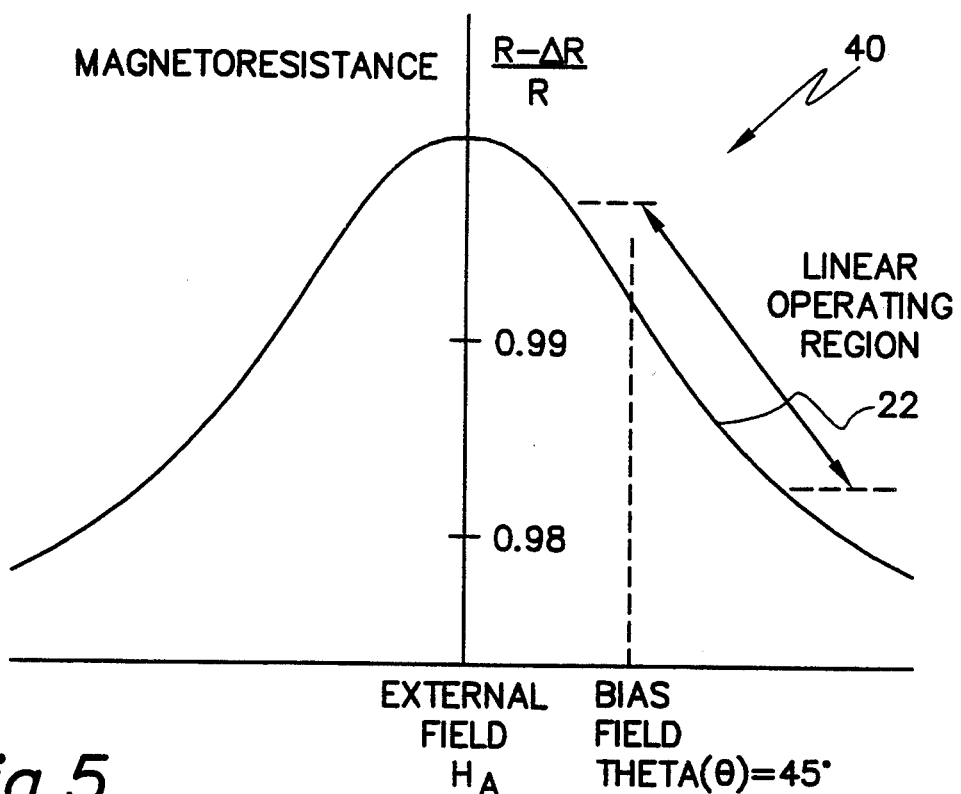
FIG. 5 is a graph of normalized resistance versus applied magnetic field.

FIG. 5 is a graph showing the magnetoresistance expressed as a ratio of the change in total resistance of the film to the film's nominal resistance which is defined as the resistance when the magnetization is perpendicular to the current per dependence of the magnetoresistance on the applied magnetic field. With the cosine-squared-shaped magnetoresistance curve, a problem one must note is linearity. Changes in resistance are linear only on portions of the magnetoresistance curve having a nearly constant slope as shown by linear operating region 22. To obtain this linear relationship, sensor 14 is subjected to a bias field that places its output in the middle of a portion of the magnetoresistance curve having a constant slope.

Figure 6:
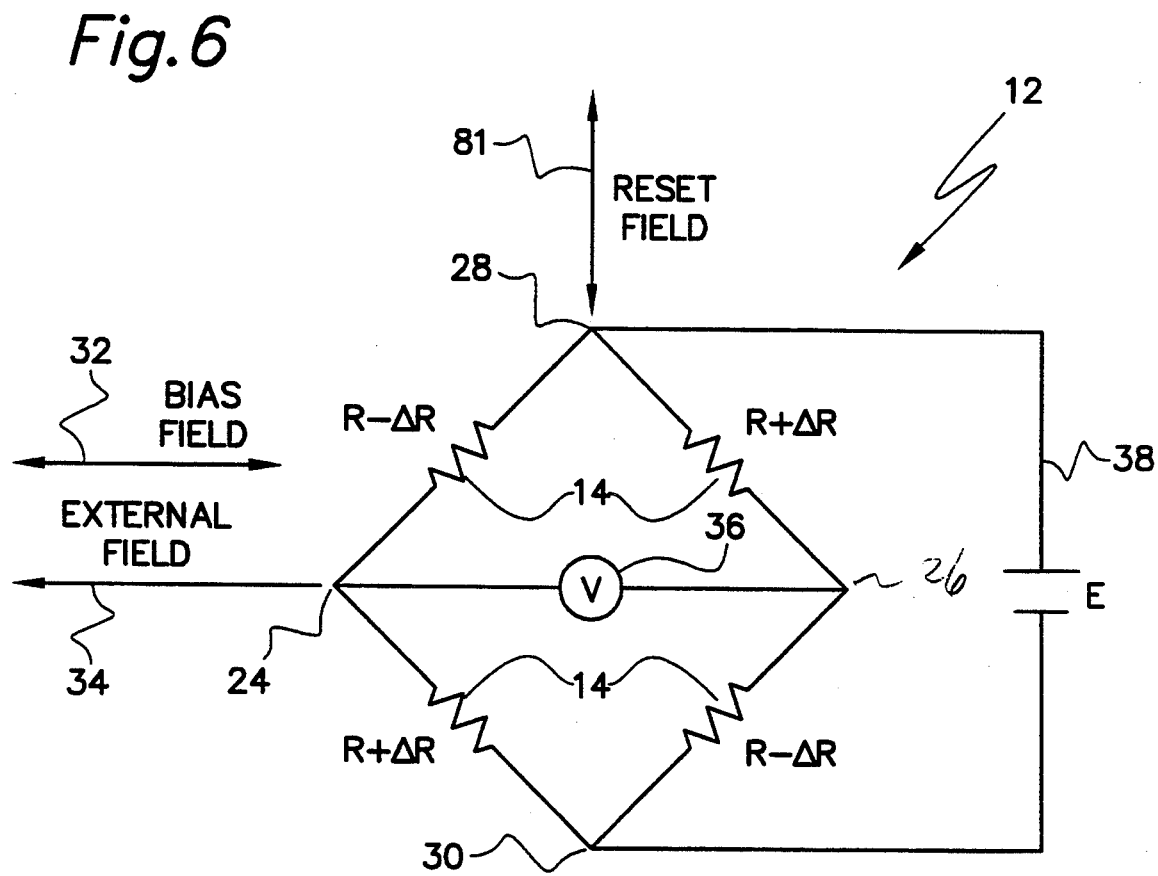
FIG. 6 is a diagram of the Wheatstone bridge of magnetoresistors.

FIG. 6 is a schematic showing the Wheatstone bridge configuration of four magnetoresistors 14. The four legs are magnetoresistors which are identical in value, and thus the bridge is balanced and has no output at points 24 and 26 with a voltage potential applied across points 28 and 30. In the presence of parallel bias and signal fields, the resistances of the two opposite legs 14 of bridge 12 increase and the resistances of the remaining two legs 14 decrease. Thus, bridge 12 develops an output voltage across points 24 and 26 that is proportional to the signal field. Reset field 81 switches the direction of easy axis 20 of elements 14. To make bridge 12 operate in linear region 22 of the magnetoresistance curve, a bias field is applied along one axis aligned with points 24 and of bridge or diamond 12. Bias field 32 affects the resistance of legs or elements 14, but because the magnetic field vector 16 and current vector 18 are at the same angle for all four legs or elements 14, the resistances of elements 14 change by the same amount. Thus, bridge 12 still has no voltage output. If bridge 12 has been placed in a signal or external field (i.e., the magnetic field to be sensed) directed along the other axis from points 26 to 24 of bridge 12, a resulting field vector 16 forms one angle theta with current vector 18 in opposite legs 14 and a different angle theta with current vector 18 in the remaining two legs 14. In the two opposite legs 14, the resistance decreases, and in the remaining two legs 14, the resistance increases. Thus, bridge 12 develops an output voltage that is proportional to signal field 34. Output voltage 36 is also proportional to the sensitivity of bridge 12. For a given supply of voltage 38, a bridge's sensitivity is a ratio of output voltage 36 to signal field 34. The more sensitive bridge 12 is, a larger output voltage 36 will be caused by signal field 34. The typical sensitivity of a permalloy bridge is about 300 parts per million per gauss. That means a bridge 12 with a power supply 38 of 10 volts that is exposed to a field of 10 milligauss (0.01 gauss) generates an offset voltage of 30 microvolts. Bridge 12 resistances typically range from 1 kilo ohm to 100 kilo ohms depending on size, sensitivity, range, and power requirements.

The two most important characteristics of a magnetoresistor are its sensitivity and its range of linearity. A sensitive resistor is one whose magnetization vector 16 rotates by a large angle when a magnetic field is applied to resistor 14. The small increments in the applied filed strength cause relatively large changes in the resistance of element 14. However, this feature also means that the magnetization saturates easily. That is, the magnetization vector 16 may point along the same direction, more or less as that of the magnetic field, and yet any further increase in the strength of the magnetic field will produce no more effect. Thus, if a film is sensitive then its range is limited.

The direction the magnetization vector 18 assumes is a consequence of the competition among the forces due to anisotropy, the demagnetizing field and the external field. Anisotropy is a property of a material which has different values of magnetic sensitivity along different directions of the material. Here, anisotropy means that magnetization vector 16 has a preferred direction in magnetoresistor 14. Magnetic thin films are deposited in fabricating magnetoresistor 14 in the presence of a magnetic field and the preferred direction of magnetization vector 16, which is called easy axis 20, is established by the magnetic field. The direction parallel to easy axis 20 is the lowest-energy configuration for magnetization vector 16. The magnetic field required to rotate magnetization vector 16 ninety degrees away from easy axis 20 is called the anisotropy field. If a very strong field has a direction 180 degrees from magnetization vector 16, then magnetization vector 16 can be "flipped" in the same direction of the field. When this strong field is removed magnetization vector 16 will keep its opposite direction but will still be parallel to easy axis 20.

The applied magnetic field may be expressed as a scaled quantity, that is the expression includes the ratio of the applied field and a quantity called the magnetic-field scale. The magnetic-field scale is a function of different parameters of the film. In a simplified case, where easy axis 20 is along or parallel to the length of magnetoresistive film 14, the magnetic field scale is the following equation:

$$H_S = H_K + \alpha \frac{T}{W} M_S$$

where $H_S$ is the magnetic field scale, $H_K$ is the anisotropy field, $\alpha$ is a constant having a value of about 10, T is the thickness and W is the width of the resistor 14 film, and $M_S$ is the saturation magnetization of resistor 14. $M_S$ is the value of magnetization where all of the magnetic moments in a given volume are aligned, which is a condition obtained by an application of a large external magnetic field.

Since an expression for magnetoresistance contains the external field as a scaled variable, the sensitivity and range of linearity of resistor 14 depend on the magnetic field scale. Sensitivity is inversely proportional to the magnetic field scale and the range of linearity is directly proportional to the field scale. If the magnetic field scale is small, magnetoresistive element 14 will be sensitive, but its range of linearity will be limited. If the magnetic field scale is large, element 14 will be comparatively insensitive, but will have a wider range of linearity. It follows that the product of the sensitivity and the range of linearity is a constant that is independent of magnetic field scale. A similar relation holds for an electronic amplifier design where the gain-bandwidth product is a constant.

If one wants a sensitive magnetoresistor 14, then the magnetic field scale is made as small as possible. The field scale may be reduced by reducing the anisotropy field or the saturation magnetization. Both the field scale and saturation magnetization depend on the material of magnetoresistor 14. Permalloy, for example, has an anisotropy field of about 3 oersteds and a saturation magnetization of about 800 emu/cc. Those characteristics are determined by the material. The only term in the magnetic field scale that can be readily changed without changing the material is the ratio of the thickness to width of magnetoresistor 14 film. Thus, the resistor 14 film may be made thinner or wider or both to achieve greater sensitivity. Also, the magnetoresistor can be made more sensitive by rotating easy axis 20 away from the direction of current vector 18.

The bias field is another parameter dependent on magnetic field scale. The bias field changes the angle between current vector 18 and magnetization vector 16 to bring the magnetization vector into the linear portion of the magnetoresistance curve 40. The bias-field strength, like the range of linearity, is proportional to the magnetic field scale. In other words, if the magnetic resistor 14 is sensitive, it will have a comparatively short linear range and require a comparatively small bias field which must be set very accurately. A less sensitive magnetoresistor 14 is more tolerant of bias field variations.

There are several ways of biasing resistor 14 films. One way is to wrap a solenoid around the magnetoresistive film wherein the current of the solenoid gives rise to a fairly uniform magnetic field along the axis of the solenoid. A disadvantage of this approach is that power is needed to maintain the bias field. An alternative is to deposit thin-film permanent magnets on top of the magnetoresistive film layer. The thin film permanent magnets such as cobalt or alloys of cobalt can be magnetized after they are deposited on the magnetoresistive film, by an application of a large magnetic field. This biasing scheme requires no maintained power, but the resultant bias magnets tend to be susceptible to temperature variations.

Rather than rotating magnetization vector 16 away from current vector 18, the magnetoresistive film 14 may be biased by rotating current vector 18 away from magnetization vector 16 as shown in FIGS. 4c and 4d. This biasing can be done by depositing angled strips 15 of a highly conductive material such as gold on the magnetoresistive film 14. The current takes the shortest path (in the direction of current vector 18) through magnetoresistive film 14 between conducting strips 15. If angle theta between magnetization vector 18 and current vector 16 is appropriately adjusted, then film 14 operates in a linear region of magnetoresistance curve 40. This biasing method, which is referred to as "barberpole" biasing because of the pattern of the conductive strips, is effective for shifting film 14 operation into a linear region of magnetoresistance curve 40, but has the disadvantage in that a smaller fraction of the magnetoresistive film 14 area is utilized for sensing. A typical magnetoresistive element 14 is made of permalloy which is an alloy of nickel and iron. Such material is preferred because it has a relatively high magnetoresistance coefficient and a zero coefficient of magnetostriction and is compatible with fabrication techniques used to make silicon integrated circuits. Thus, bridge 12 may be an integrated circuit having four permalloy resistors sputter-deposited on a silicon substrate. Several resistors 14 may be designed so as to accommodate laser trimming so that the bridge 12 may be balanced in production. Each resistor 14 is biased in that its direction of magnetization vector 16 is rotated to bring it into a region where a change in resistance which results from a change in the applied magnetic field is linear and relatively large. This biasing is done by sputtering a thin film of cobalt over resistors 14 and magnetizing the cobalt. Such magnetoresistor 14 is relatively radiation hard. Even though permalloy (NiFe) is a preferred material, other materials may be utilized and offer a resistive coefficient of greater than 2 percent saturation. Further material geometries may increase the resistive coefficient. For example, multilayer stacks of magnetic thin films may be designed and built to exhibit a magnetorestrictive coefficient approaching 25 percent, However, such design may result in a less stable and repeatable readout of the magnetorestrictive effect.

FIGS. 1 and 8a-c reveal a configuration 10 of a magnetoresistor sensor. Magnetoresistive bridge 12 has four permalloy magnetoresistive elements 14 connected in a Wheatstone bridge (to cancel first order temperature effects) having plus and minus voltage sources connected at opposite connections of bridge 12. The other two opposite bridge connections are connected to the inputs of differential amplifier 52. Barber-pole biased permalloy elements 14 can be anywhere between a few hundred ohms to 100 thousand ohms. Each of the voltage sources are connected through a 511 ohm resistor to bridge 12. Amplifier 52 is a model LT1101 by Linear Technology.

The output of amplifier 52 goes to analog switch 54. Analog switch 54 is model DG308A by Siliconix Incorporated. The outputs of analog switch 54 are connected to the differential inputs of operational amplifier 80. Feedback capacitor 82 of integrator 56 is 0.1 microfarad. Output 78 from integrator 56 goes to feedback coil 62, resistor 58 and sample and hold device 64. Resistor 58 is 715 ohms. Resistor 58 is a precision resistor which is a current to voltage converter for converting the current out of integrator 56 through feedback coil 62 for providing the signal to device 64. Operational amplifiers 80 and 66 can be models OP-97 or OP-22.

Sample and hold device 64 has sample and hold amplifiers 83 and 84 which output signals, alternately to differential inputs of operation amplifier 66. Sample and hold amplifiers 83 and 84 are model LF398AN by National Semiconductor Corporation. Circuits 83 and 84 each have a 0.01 microfarad polypropylene capacitor. Sample and hold device 64 may instead be any other sampling device, such as an analog-to-digital converter controlled by a microprocessor wherein the sampling is synchronized by clock 70.

Figure 7:
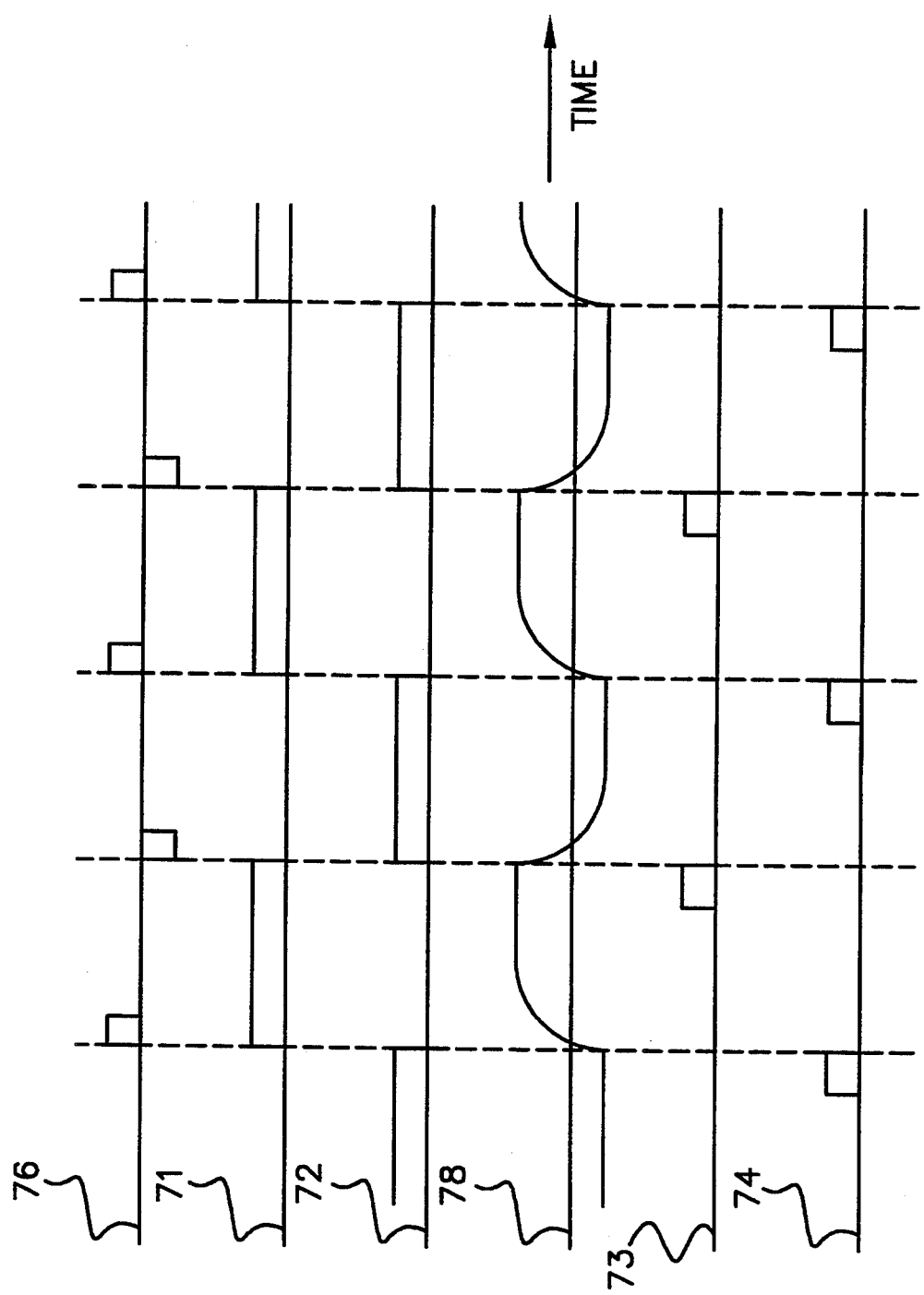
FIG. 7 is a timing diagram of various signals of a magnetometer.
Figure 8A:
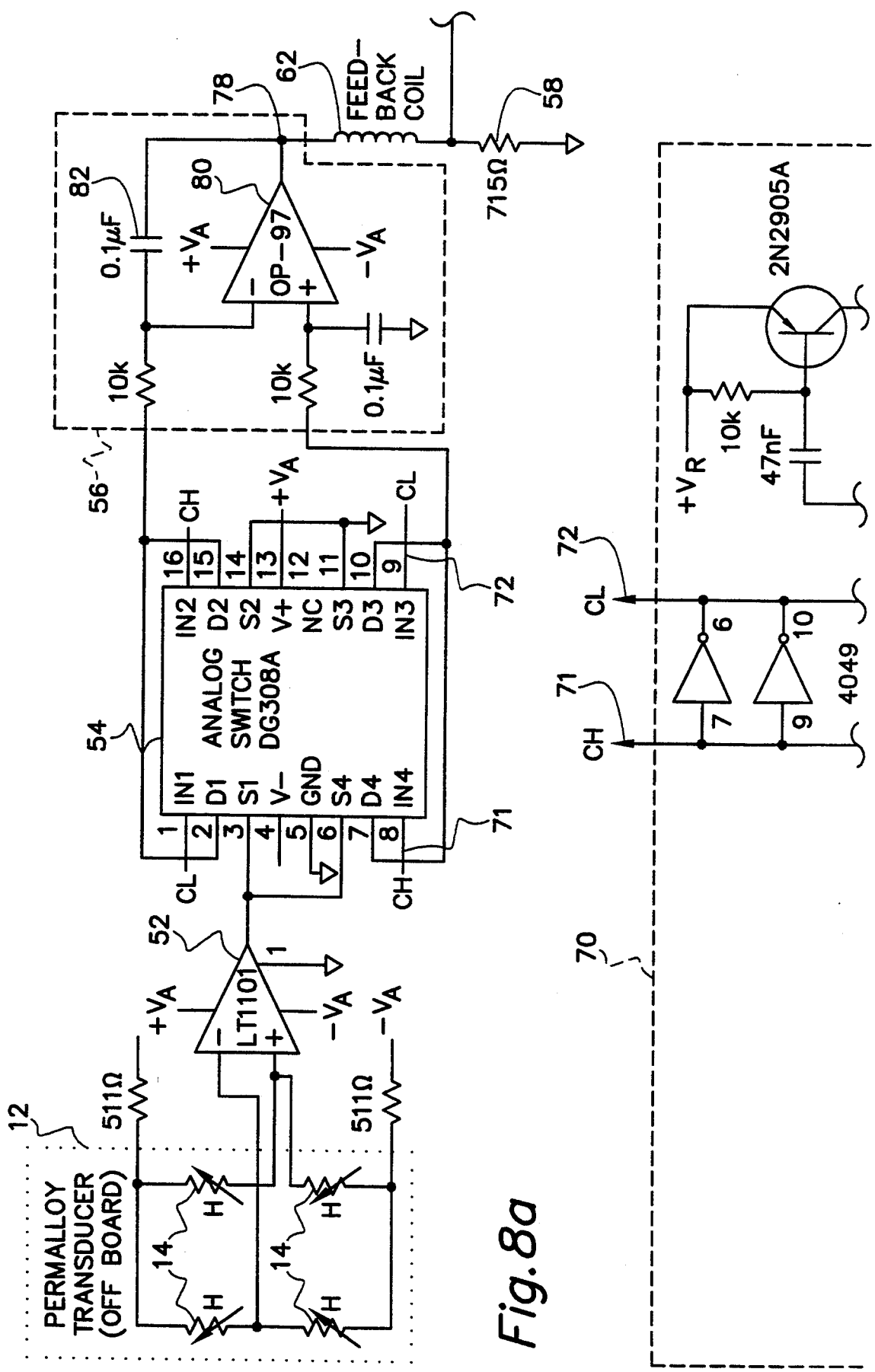
FIGS. 8a-c are a detailed schematic of the magnetometer having feedback switches before the integrator and having a sample and hold device.
Figure 8B:
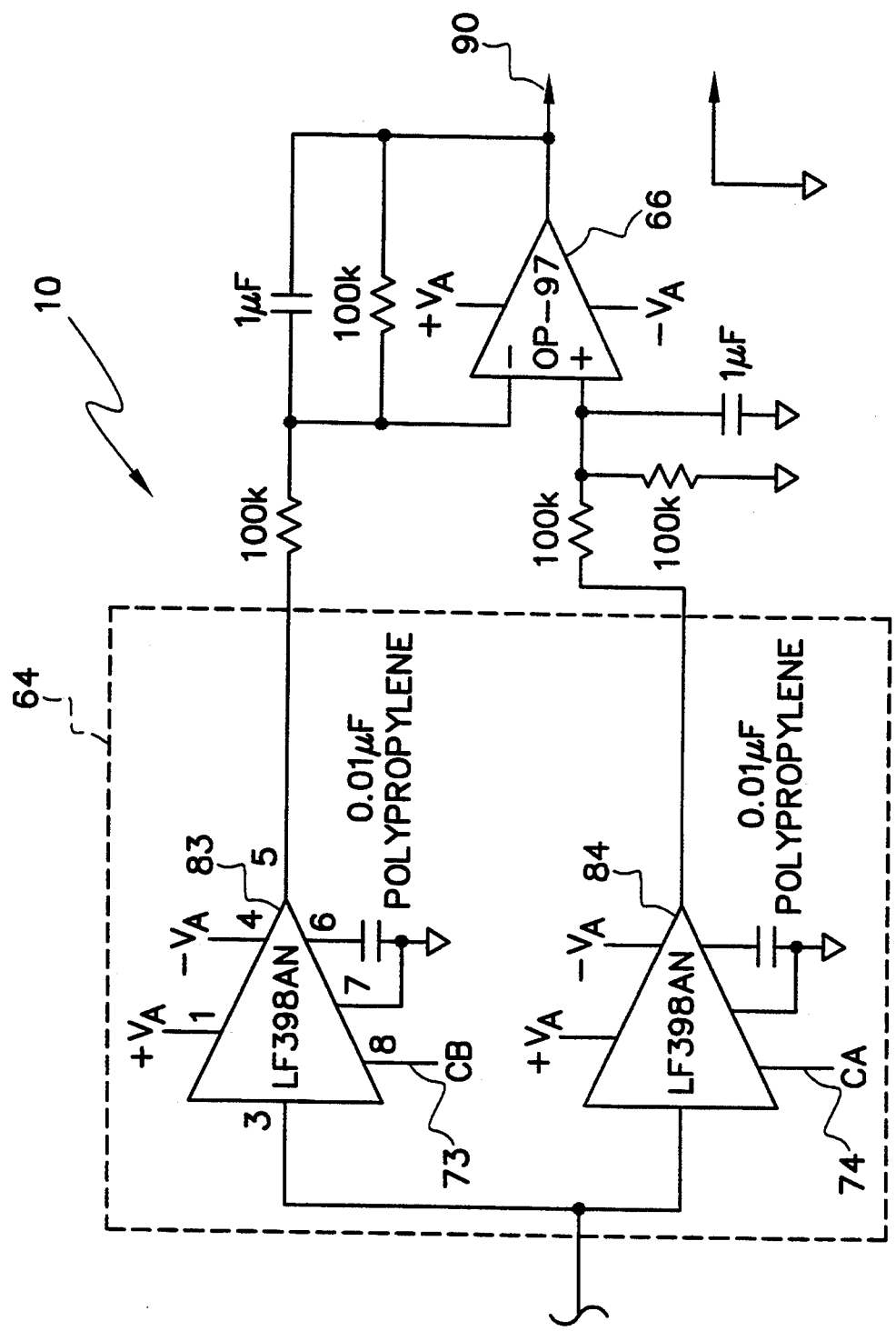
Figure 8C:
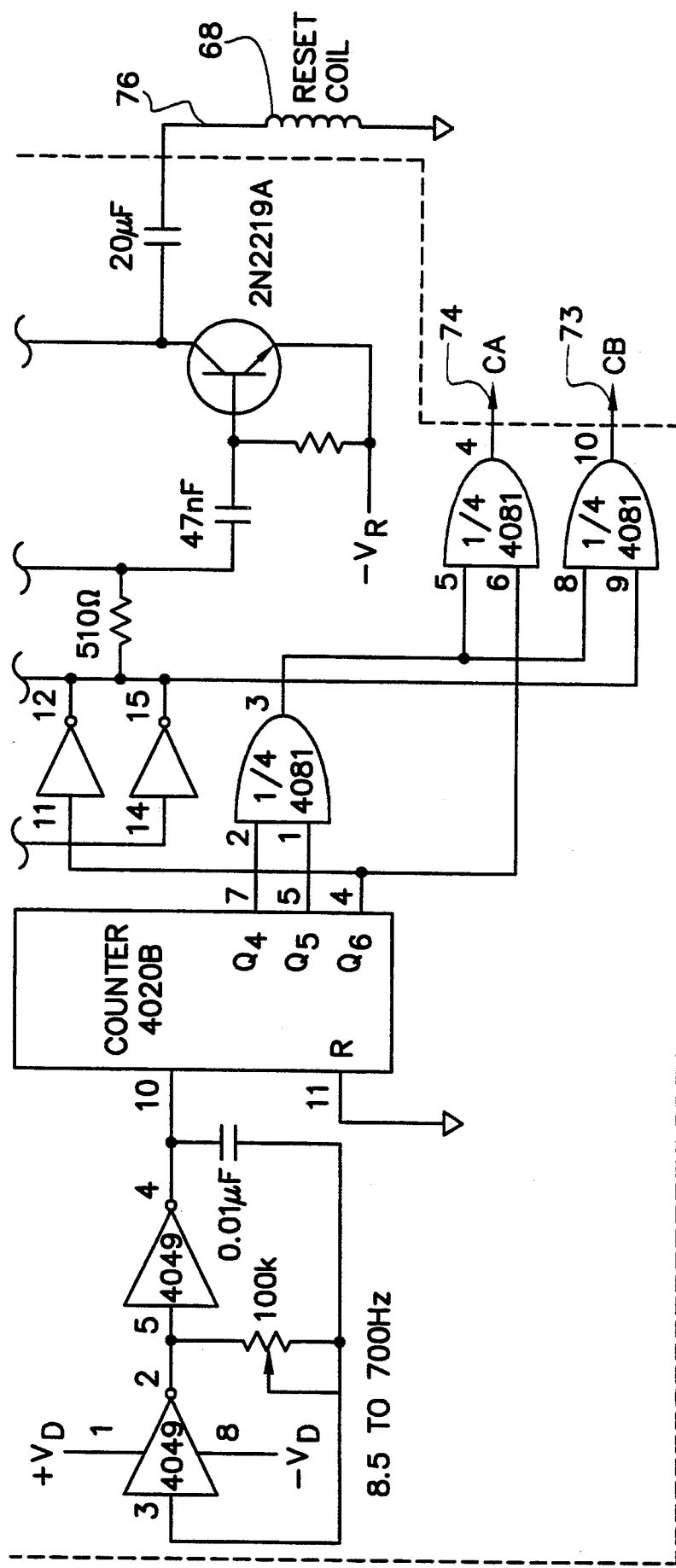
Figure 9A:
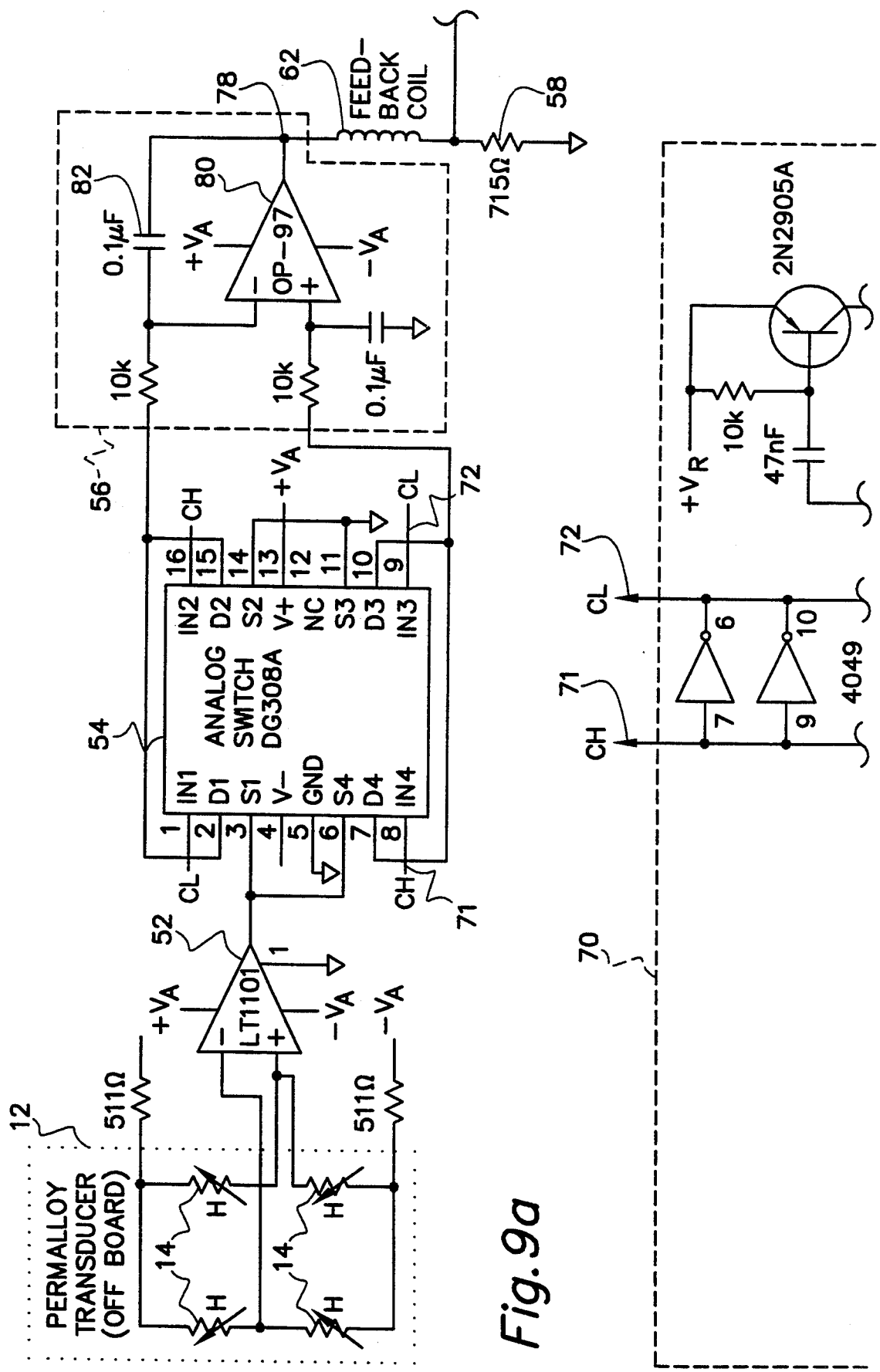
FIGS. 9a-c are a detailed schematic of the magnetometer having feedback switches before the integrator and not having a sample and hold device.
Figure 9B:
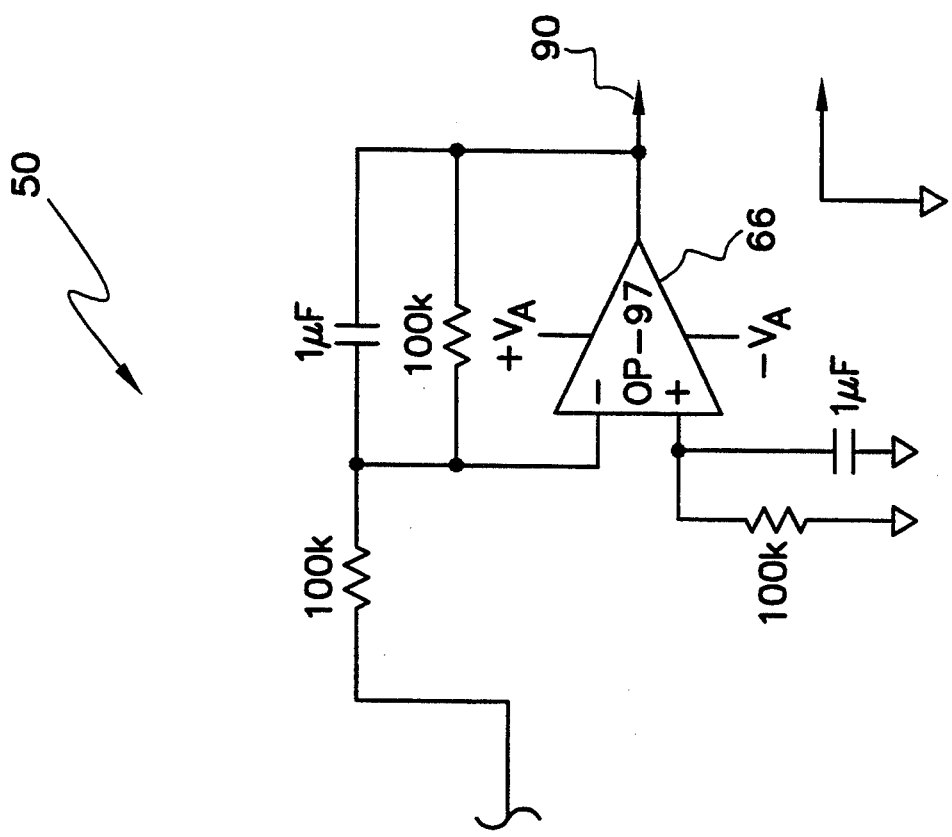
Figure 9C:
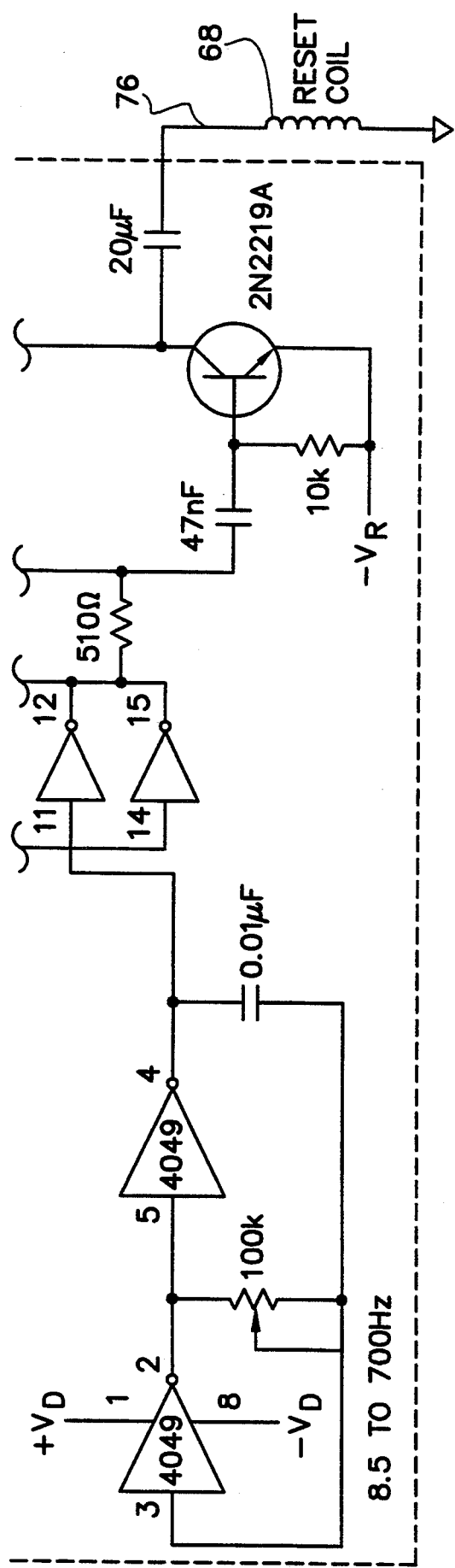
Figure 10A:
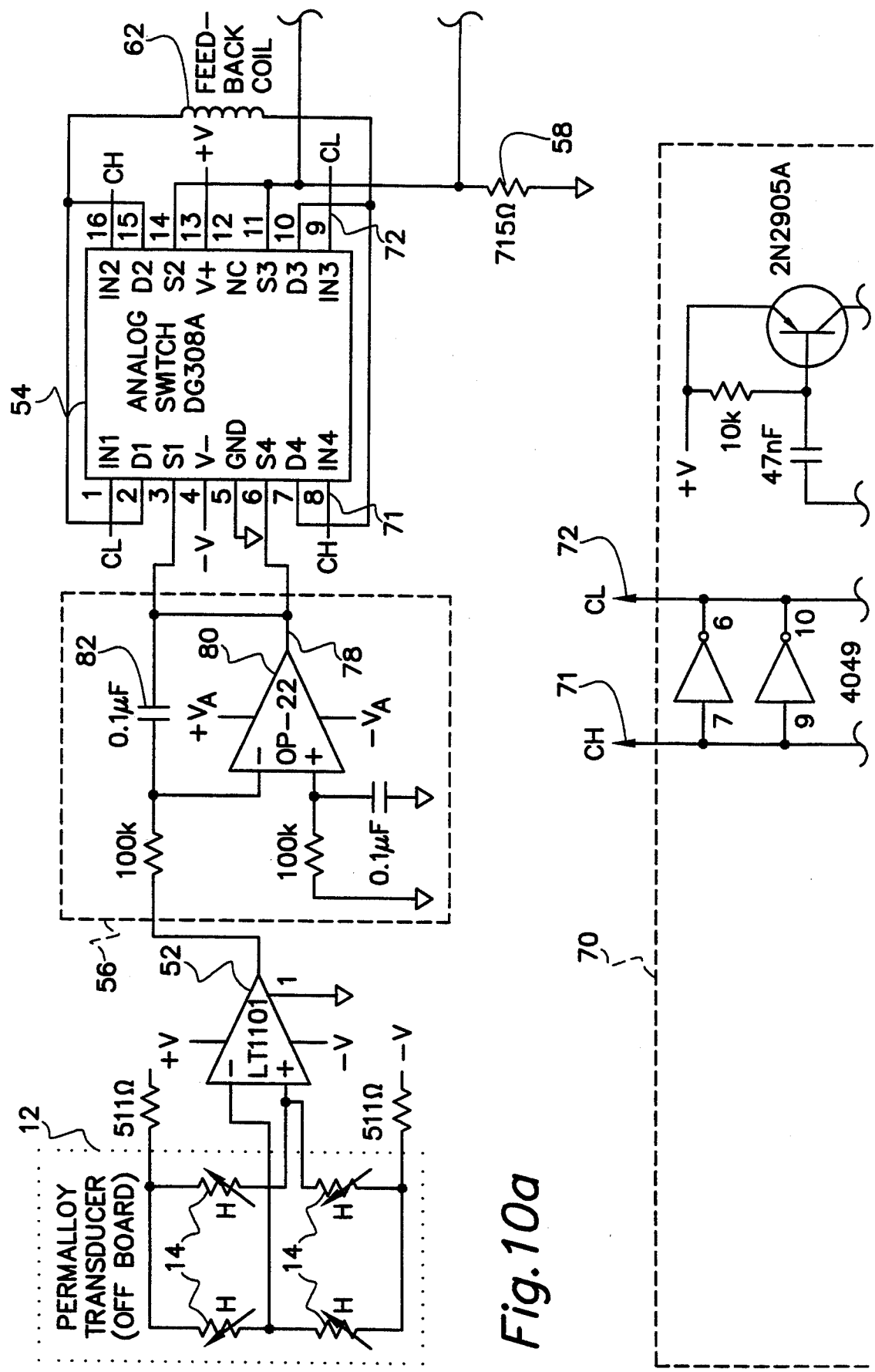
FIG. 10a-c are a detailed schematic of the magnetometer having feedback switches after the integrator and having a sample and hold device.
Figure 10B:
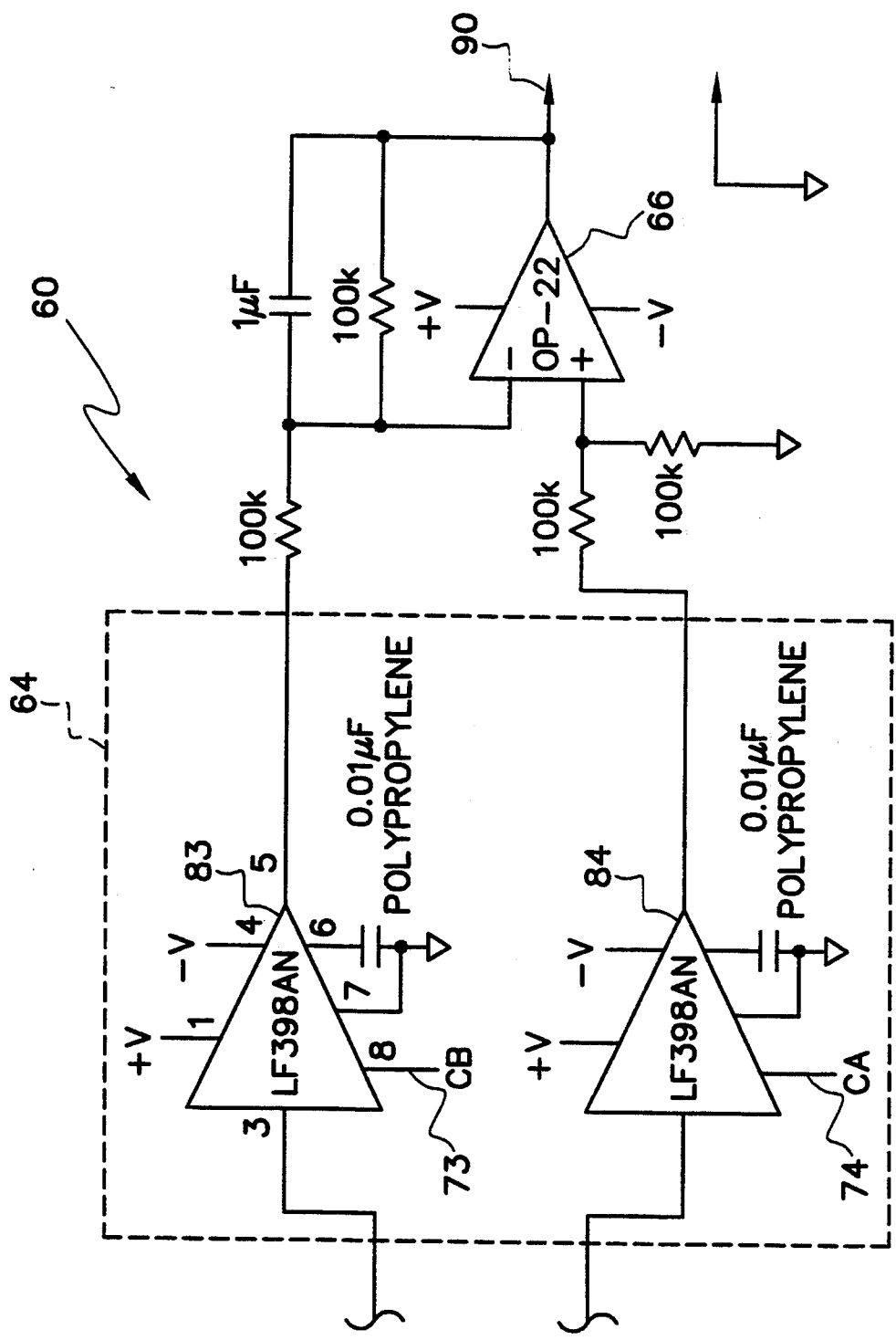
Figure 10C:
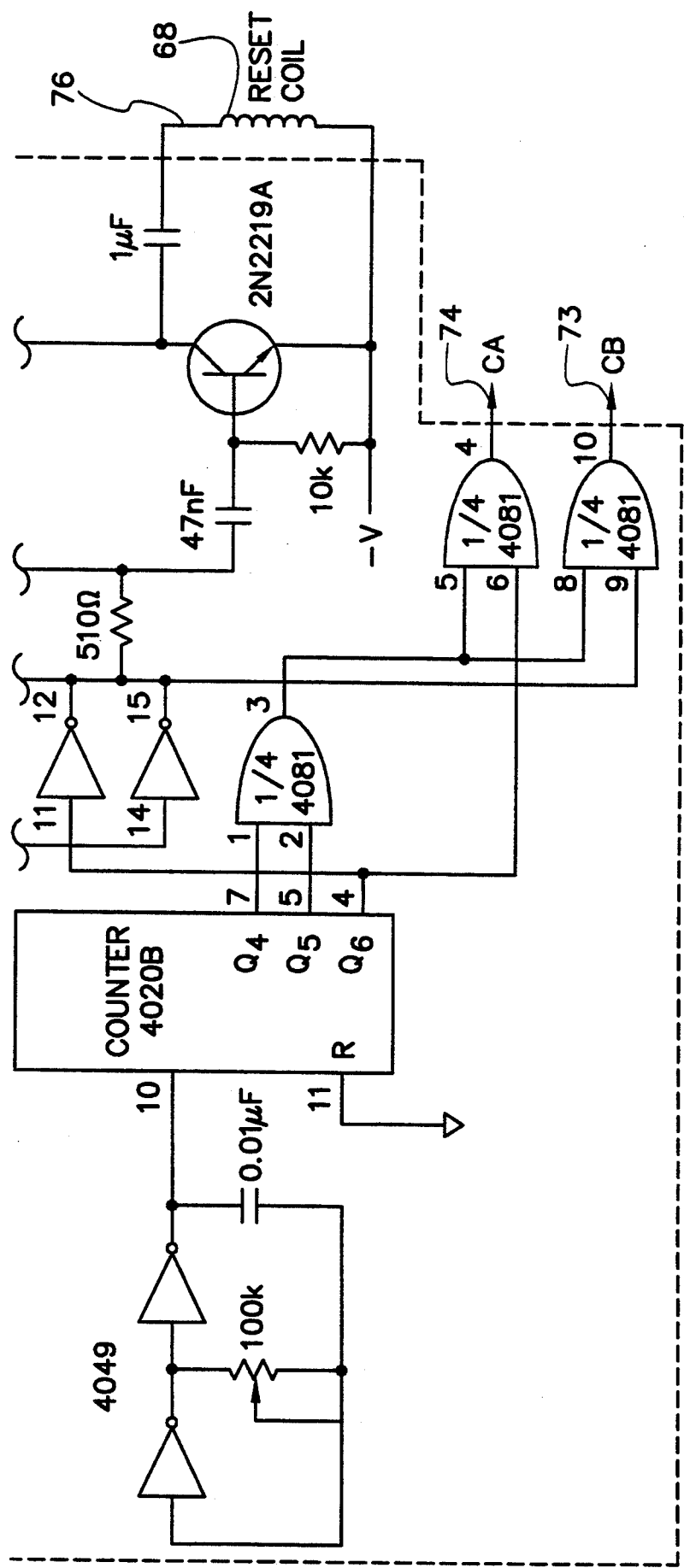

Operational amplifier 66 is a model OP-97. Amplifier 66 may also be a model OP-22. Amplifier 66 acts as a low pass filter having an output 90. Output 90 is a linear indication of magnetic fields affecting bridge 12. Feedback coil 62 counter-reacts magnetically to the external magnetic field which affects bridge 12, nulling the input to amplifier 52. Feedback coil 62 is magnetically coupled to bridge 12 along the most sensitive axis of bridge 12. Reset coil 68 is magnetically coupled to bridge 12. The axis of reset coil 68 is approximately orthogonal to the axis of feedback coil 62. Reset coil 68 switches the direction of easy axis 20 of elements 14, periodically, by 180 degrees, with a reset field 81. Signal 76 from a clock 70 goes to reset coil 68 thereby effecting the switching or flipping of easy axis 20 of elements 14. FIG. 7 shows the timing and shape of signal 76 relative to the other signals in systems 10, 50 and 60.

Clock 70 has a frequency that varies from one to a few kilohertz which may be set according to application of switched-magnetization closed-loop magnetometer 10. The counter in clock 70 is a model CD 4020B by RCA.

Clock 70 outputs signals 71 and 72 to switch 54. Switch 54 alternately switches connections $\phi 1$ and $\phi 2$ which switch the polarities of the differential inputs to integrator 56. Output 78 goes to feedback coil 62 and is in synchronism with the switching of easy axis of elements 14 by reset coil 68. Signal 78 goes to device 64 via coil 62 and divider resistor 58. Sample and hold circuits 83 and 84 alternately sample signal 78 in accordance with input signals 73 and 74, respectively, consistent with the timing diagram of FIG. 7. Signals 73 and 74 are synchronized with signals 76, 71 and 72 by clock 70.

The sampled signals from circuits 83 and 84, of signal 78 are differenced by amplifier 66. One signal from circuit 83 is at a voltage of $V_H + V_T$. The signal from circuit 84 is at a voltage of $-V_H + V_T$. These signals are differenced resulting in an output voltage of $2V_H$ at terminal 90. The temperature induced voltage offsets in the bridge and the closed loop are differenced out, that is, $V_T$ of one signal is subtracted from $V_T$ of the other signal.

FIGS. 2 and 9a-c are diagrams of another configuration 50 of switched-magnetization closed-loop magnetometer. Magnetometer 50 is similar to magnetometer 10 except that it does not have sample and hold device 64. The output 78 of integrator 56 goes onto amplifier 66. Signal 78 to the input of amplifier 66 is a direct current (DC) voltage level of $2V_H$ having an alternating plus/minus $V_T$ superimposed on it. Amplifier 66 filters out the superimposed alternating $V_T$ signal for a somewhat smooth output of $2V_H$ at terminal 90. Output 90 of configuration 50 is not quite as clean as output 90 of configuration 10 or 60. Otherwise, configuration 50 functions in a similar manner as configuration 10.

Configuration 60 of FIGS. 3 and 10a-c is like configuration 10 of FIGS. 1 and 8a-c, except that analog switch 54 is connected between integrator 56 and device 64 in configuration 60, whereas configuration 10 has analog switch 54 connected between amplifier 52 and integrator 56. Otherwise, the functioning of configuration 60 is similar to that of configuration 10. Model numbers of the components are the same among configurations 10, 50 and 60. Also, configuration 50 does not have sample and hold device 64 as in configurations 10 and 60, thereby resulting in the absence in configuration 50 of those parts and certain parts in clock 70 that provide signals for device 64.

We claim:

1. A resetting closed-loop magnetoresistive sensor (10) comprising:
   a first magnetoresistor having first and second terminals;
   a second magnetoresistor having a first terminal connected to the first terminal of said first magnetoresistor and having a second terminal;
   a third magnetoresistor having a first terminal and having a second terminal connected to the second terminal of said second magnetoresistor;

a fourth magnetoresistor having a first terminal connected to the first terminal of said third magnetoresistor and having a second terminal connected to the second terminal of said first magnetoresistor;

wherein said first, second, third and fourth magnetoresistors have a resistance that is affected by a magnetic field;

a first amplifier having inverting input connected to the first terminals of said first and second magnetoresistors and a non-inverting input connected to the first terminals of said third and fourth magnetoresistors, the amplifier amplifying a first signal caused by the magnetic field, into a second signal at an output;

a clock having an output frequency;

a switch having a first input connected to the output of said first amplifier, a second input connected to a ground terminal, a third input connected to the output of said clock, and having first and second outputs, wherein said clock causes the second signal at the first input to alternate at first and second outputs, at the frequency, while the second signal is at one of the first and second outputs, a ground signal is at the other of the first and second outputs;

a second amplifier having an inverting input connected to the first output of said switch and a non-inverting input connected to the second output of said switch, having an output, and having a capacitor connected between the inverting input and the output of said second amplifier;

a feedback coil, proximate to said first, second, third and fourth magnetoresistors, having a first terminal connected to the output of said second amplifier and having a second terminal, wherein said feedback coil is for nulling the first signal caused by the magnetic field;

a resistor having a first terminal connected to the second terminal of said feedback coil and having a second terminal connected to the ground terminal;

a first sample and hold circuit having a first input connected to the second terminal of said feedback coil, a second input connected to said clock, and having an output;

a second sample and hold circuit having a first input connected to the second terminal of said feedback coil, a second input connected to said clock and having an output;

a third amplifier having an inverting input connected to the output of said first sample and hold circuit and a non-inverting input connected to the output of said second sample and hold circuit, and having an output; and a reset coil proximate to said first, second, third and fourth magnetoresistors, having a first terminal connected to said clock and a second terminal connected to the ground terminal, said reset coil flipping an easy axis of magnetoresistors at the frequency; and wherein:

the second signal is alternating between the inverting and non-inverting inputs of said second amplifier resulting in an alternating signal having first and second polarities, to said feedback coil and to said first and second sample and hold circuits;

the first sample and hold circuit is switched at the frequency to sample the alternating signal at the first polarity;

the second sample and hold circuit is switched at the frequency to sample the alternating signal at the second polarity; and the third amplifier inverts the alternating signal at the first polarity and non-inverts the alternating signal at the second polarity and outputs a signal at the first polarity, resulting in reduction of any temperature induced voltage offsets originating in said first, second, third and fourth magnetoresistors.

2. An easy axis resetting closed-loop magnetoresistive sensor (60) comprising:

four magnetoresistors connected end-to-end in a form of a bridge having first and second pairs of terminals, having a voltage applied to the first pair of terminals, and wherein a magnetic field can affect the resistance of the four magnetoresistors and thus cause a first signal at the second pair of terminals; and a first amplifier, having an inverting input and a non-inverting input connected to the second pair of terminals, for amplifying the first signal into a second signal at an output of said first amplifier;

a second amplifier having an input connected to the output of said first amplifier, having an output, and having a capacitor connected between the output and input of said amplifier, for integrating the second signal into a third signal at the output of said second amplifier;

a clock;

a switch, having a first terminal connected to the output of said second amplifier, a second terminal connected through a resistance to a ground terminal, a third input connected to said clock, said switch switching a polarity of the third signal into a fourth signal at a frequency as determined by said clock, and the fourth signal being at first and second outputs;

a feedback coil, magnetically coupled to the bridge, having a pair of terminals connected to the first and second outputs, for nulling the first signal at the second pair of terminals of the bridge;

a first sampling circuit having a first input connected to the second terminal of said switch, having a second input connected to said clock, and having an output, for sampling a fourth signal from said switch, and providing a fifth signal at the output;

a second sampling circuit having a first input connected to the second terminal of said switch, having a second input connected to said clock and having an output, for sampling a fourth signal from said switch, providing a sixth signal at the output, the fourth signal sampled alternately by said first and second sampling circuits at a rate equivalent to the frequency of said clock, in synchronism with the switching of said switch;

a third buffer connected to the outputs of said first and second sampling circuits for inverting one of the fifth and sixth signals, and the closed loop canceled out, combining the signals at an output into a seventh signal having temperature induced offsets at the second pair of terminals of the bridge and being an indication and measure of the magnetic field affecting the resistance of the four magnetoresistors; and a reset coils connected to said clock for changing the easy axes of the four magnetoresistors at a rate equivalent to the frequency of the clock and in synchronism with the switching of said switch.

3. A resetting closed-loop magnetoresistive sensor (50) comprising:

magnetoresistive means, having a magnetic axis, for sensing a magnetic field and outputting a first signal in the presence of the magnetic field;

a clock means for providing a signal having a frequency;

resetting means, connected to said clock means and magnetically coupled to said magnetoresistive means, for reversing the magnetic axis at the frequency of said clock means;

switching means, connected to said magnetoresistive means and to said clock means, having first and second outputs, for switching the first signal alternatively to the first and second outputs at the frequency of said clock means;

an integrating means, having an inverting input connected to the first output of said switching means and having a non-inverting input connected to the second output of said switching means, and having an output with a second signal that is an integrated first signal, having a polarity changing at the frequency of said clock means in synchronism with the reversing of the magnetic axis; and a feedback means, connected to the output of said integrating means and magnetically coupled to said magnetoresistive means, for counter-reacting magnetically to the magnetic field sensed by said magnetoresistive means and nulling the first signal;

an output means, connected to said feedback means, for outputting a third signal indicative of the magnetic field sensed.

4. The magnetoresistive sensor of claim 3 further comprising:

a first sampling means, connected to said output means and to said clock means, and having an output, for sampling the third signal at the frequency of said clock means and synchronized to the polarity changing of the second signal;

a second sampling means, connected to said output means and to said clock means, and having an output, for sampling the third signal at the frequency of said clock means and synchronized to the polarity changing of the second signal, the sampling of the third signal at a first periodic duration of time separate from a second periodic duration of time when said first sampling means is sampling the third signal, and at a polarity of the third signal different from the polarity of the third signal when sampled by said first sampling means; and a buffer means, having an inverting input connected to the output of said first sampling means and a non-inverting input connected to the output of said second sampling means, and having an output, for combining the sampled signals from said first and second sampling means into a fourth signal having temperature induced offsets of the first signal differenced out, the fourth signal at the output of said buffer means indicative of the magnet field at the magnetoresistive means.

* * * * *